US007850462B2

(12) United States Patent
Nakagawa

(10) Patent No.: US 7,850,462 B2
(45) Date of Patent: Dec. 14, 2010

(54) SPRING TAB OF AN ELECTRIC JUNCTION BOX

(75) Inventor: Tooru Nakagawa, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 12/402,757

(22) Filed: Mar. 12, 2009

(65) Prior Publication Data

US 2010/0051311 A1 Mar. 4, 2010

(30) Foreign Application Priority Data

Sep. 3, 2008 (JP) ............................ 2008-226337

(51) Int. Cl.
*H01R 12/00* (2006.01)
*H05K 1/00* (2006.01)

(52) U.S. Cl. .................. 439/76.2; 439/620.27; 439/949

(58) Field of Classification Search ................ 439/76.2, 439/949, 620.26, 620.27
See application file for complete search history.

(56) References Cited

U.S. PATENT DOCUMENTS 1,874,593 A * 8/1932 Olson ......................... 439/883
2,631,633 A * 3/1953 Peckham .................... 411/134
3,190,333 A * 6/1965 Lanius, Jr. .................. 411/134
5,645,457 A * 7/1997 Hirayama et al. ........... 439/801
6,520,804 B2 * 2/2003 Sumida et al. ......... 439/620.27
7,070,461 B1 * 7/2006 Pavlovic et al. ............. 439/766
7,176,780 B2 * 2/2007 Iwata ......................... 337/188
7,347,733 B2 * 3/2008 Murakami ............. 439/620.27
7,568,921 B2 * 8/2009 Pavlovic et al. ............ 439/76.2
2005/0285709 A1 * 12/2005 Matsumura et al. ......... 337/227
2008/0153339 A1 6/2008 Suzuki et al.
2008/0200045 A1 * 8/2008 Akahori et al. ............ 439/76.2

FOREIGN PATENT DOCUMENTS

JP 2001-203010 7/2001
JP 2002-185165 6/2002

OTHER PUBLICATIONS

English language Abstract of JP 2001-203010, Jul. 27, 2001.
English language Abstract of JP 2002-185165, Jun. 28, 2002.

* cited by examiner

*Primary Examiner*—Hae Moon Hyeon
(74) *Attorney, Agent, or Firm*—Greenblum & Bernstein P.L.C.

(57) ABSTRACT

An obliquely bent spring tab is projected from a circumference of a bolt hole in a power connector of a bus bar. When the bus bar is housed in and fixed to a case, the spring tab is in stable surface contact with a bolt. Thereby, conductivity inspection can be performed by connecting a conductivity inspection apparatus to the bolt.

15 Claims, 5 Drawing Sheets

Prior Art

Prior Art

SPRING TAB OF AN ELECTRIC JUNCTION BOX

CROSS-REFERENCE TO RELATED APPLICATIONS

The present application claims priority under 35 U.S.C. §119 of Japanese Application No. 2008-226337, filed on Sep. 3, 2008, which is herein expressly incorporated by reference in its entirety.

BACKGROUND OF THE INVENTION

1. Field of the Invention

The present invention relates to an electric junction box, more specifically to an electric junction box allowing conductivity inspection thereof before the electric junction box mounted in a vehicle is connected to a battery.

2. Description of Related Art

When a bus bar and a power line housed in an electric junction box are connected in a conventional manner, the power line is connected to a terminal having a bolt hole, and the bus bar is provided with a bolt hole. Then, a bolt is inserted through the bolt hole in the power terminal and the bolt hole in the bus bar, and is fastened and connected with a nut.

For example, Japanese Patent Laid-open Publication No. 2001-203010 discloses a structure of connecting a bus bar 2 and a power line 4 housed in a case 1, as shown in FIGS. 6A and 6B. Specifically, a connector 2*a* is projected from an upper end portion of the bus bar 2, the connector 2*a* being bent to form a square C shape. A head 3*a* of a bolt 3 is fitted into the connector 2*a*, such that a bolt portion 3*b*is projected upward from a slit 2*b*of the connector 2*a*. A fixing portion 1*a* is provided at a corner portion of the case 1, the fixing portion 1*a* being provided with a through-hole connecting inside. The bolt portion 3*b*is projected through the through-hole to outside the case 1. A bolt hole 5*a* in an LA terminal 5 (i.e., power terminal) connected to the power line 4 is fitted to the bolt portion 3*b*, and fastened with a nut 6. Thereby, the bus bar 2 and the power line 4 are connected.

A fusible link unit has recently been employed for an electric junction box for vehicles. The fusible link unit houses a bus bar integrally provided with a fusible link in an exclusive housing. The fusible link unit allows downsizing of an electric junction box, but it generates a large amount of heat. In order to increase heat dissipation and to enhance workability in fastening a bolt, replacing a fuse, and performing other operations, the fusible link unit is often inserted in a housing recess having an opening toward an external surface side of a case.

As shown in FIG. 7, for instance, a housing recess 102 having an upper surface opening is provided to a case 101. A head 104 of a bolt 103 is buried on an upper surface side of the case in a location adjacent to the housing recess 102, such that a bolt portion 105 is projected upward. Further, a battery input terminal 107 is horizontally projected from an upper portion of a fusible link unit 106 inserted and housed in the housing recess 102, as shown in FIGS. 7 and 8, the battery input terminal 107 extending from a fusible link integrated bus bar. A bolt hole 108 in the battery input terminal 107 is fitted to the bolt portion 105 of the bolt 103. Then, a bolt hole 111 in an LA terminal 110 connected to a terminal of a power line 109 is fitted from above and fastened with a nut 112. Thereby, the fusible link integrated bus bar and the power line 109 are electrically conducted.

On a vehicle assembly line, conductivity inspection may be performed in a process before the LA terminal 110 and the nut 112 are attached to the bolt 103, as shown in FIG. 9. In this case, a contact between the battery input terminal 107 and the bolt 103 is unstable when the nut 112 is not fastened, and thus conductivity to the bus bar is unstable. As a result, the conductivity inspection cannot be performed accurately.

[Related Art 1] Japanese Patent Laid-open Publication No. 2001-203010

SUMMARY OF THE INVENTION

The present invention is provided to address the above-described problem. The present invention provides an electric junction box, in which bolts are passed through bolt holes provided in a bus bar which is inserted and housed in a case of the electric junction box, and terminals connected to end portions of power lines are fastened to the bolts with nuts and electrically connected thereto. The present invention is intended to achieve accurate conductivity inspection of the bus bar in a process before the power terminals are fastened and fixed to the bolts with the nuts.

In order to address the problem, the present invention provides an electric junction box, in which bolt holes provided in power connectors of a bus bar housed in a case are fitted to bolts fixed to a case, such that the bus bar and the bolts are electrically conducted. An obliquely bent spring tab is projected from a circumference of each of the bolt holes in the bus bar; and the spring tab is in surface-to-surface contact with each of the bolts when the bus bar is housed in and fixed to the case.

A head of each of the bolts is fixed to the case; and the spring tab is in surface contact with the bolt head. The power terminals are fastened to the bolts with nuts in a subsequent process.

As described above, the spring tab, which is previously bent and projected from the circumference of the bolt hole in the bus bar, can be in surface contact with the bolt with contact pressure, when the bus bar is fixed inside the case even before the nut is screwed into the bolt. Thereby, when a conductivity inspection apparatus is connected to the bolt and a current is supplied to the bolt, the current is stably supplied to the bus bar via the bolt, and thus conductivity inspection of the bus bar can be performed accurately. When the electric junction box according to the present invention is used for vehicles, accurate conductivity inspection can be performed even in a process before the power terminals are fastened and fixed to the bolts with the nuts on a vehicle assembly line, since the bolts and the bus bar are in stable surface contact when the power is supplied from the connected conductivity inspection apparatus.

One spring tab is projected from the circumference of the bolt hole in the bus bar. Alternatively, two spring tabs may be projected from the circumference of the bolt hole at opposing positions, or two to four spring tabs may be provided on the bolt hole having a 90 degrees distance in between.

The spring tab is provided on the circumference of the bolt hole toward the center of the bolt hole, and is bent obliquely downward toward the bolt head. In a process in which the bus bar is fixed to a predetermined position in the case, the spring tab is pressed to a shaft circumference of the bolt head, and thus deformed into a flat shape so as to be in surface contact.

It is preferable that the bus bar be a commonly called fusible link integrated bus bar, which is integrally provided with a fuse. It is preferable that the bolt hole in the battery side connector and the bolt hole in the alternator side connector be respectively provided with the spring tab, when the bus bar is connected to a battery and an alternator.

It is preferable that the fusible link integrated bus bar be housed in an exclusive housing, and then housed in and fixed to a housing provided in the case of the electric junction box; that the connectors provided with the bolt holes be projected from the exclusive housing; and that, when the exclusive housing is housed in and fixed to the case, the spring tab be pressed against the bolt head and deformed so as to be in surface contact.

As described above, the obliquely bent spring tab is projected from the circumference of the bolt hole provided in the bus bar housed in the case, according to the present invention. Thus, when the bolt hole in the bus bar is fitted to the bolt fixed to the case and the bus bar is housed in and fixed to the case, the spring tab can be in surface contact with the bolt head with contact pressure, and thereby the bolt and the bus bar are stably contacted. When a conductivity inspection apparatus is connected to the bolt and power is supplied thereto in a process before the power terminal connected to the power source is fastened and fixed to the bus bar using the nut and bolt, the power is stably supplied from the bolt to the bus bar via the spring tab, and thereby conductivity inspection can be performed accurately.

BRIEF DESCRIPTION OF THE DRAWINGS

The present invention is further described in the detailed description which follows, with reference to the noted plurality of drawings by way of non-limiting examples of exemplary embodiments of the present invention, in which like reference numerals represent similar parts throughout the several views of the drawings, and wherein.

DETAILED DESCRIPTION OF PREFERRED EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

The embodiment of the present invention is explained below with reference to the drawings. An electric junction box 10 according to a first embodiment of the present invention is shown in FIGS. 1 to 4B.

Figure 1:
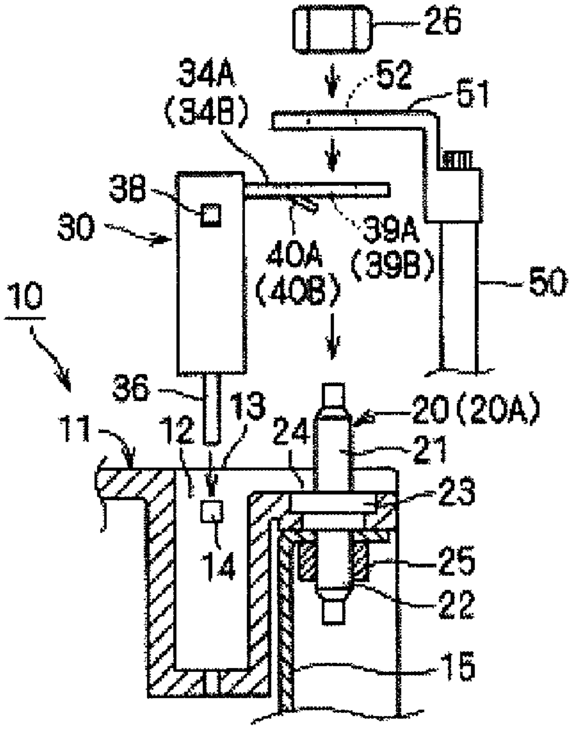
FIG. 1 is an exploded cross-sectional view of a relevant portion of an electric junction box according to a first embodiment.

The electric junction box 10 is a relay box connected to wire harnesses routed in a vehicle. As shown in FIG. 1, the electric junction box 10 includes a case 11 provided with a fusible link unit housing recess 12, which has an insertion inlet 13 opened on an upper surface. A fusible link unit 30 is vertically inserted from above into the fusible link unit housing recess 12, and is fitted and fixed to the case 11.

Figure 2:
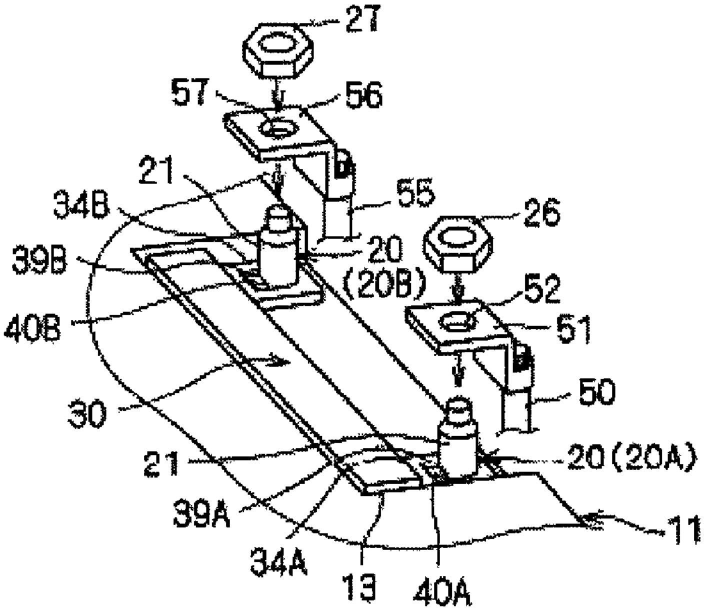
FIG. 2 is a perspective view of a relevant portion when a fusible link unit is fitted to a case.

Two bolts 20 (20A and 20B) are fixed on an upper side of the case 11 in a location adjacent to the fusible link unit housing recess 12, as shown in FIG. 2.

Each of the bolts 20 is a dual threaded bolt having an upper shaft 21 and a lower shaft 22, and a large-diameter head 23 therebetween as an intermediate fixing portion, as shown in FIG. 1 (bolt 20A shown as an example). The lower shaft 22 and the head 23 of the bolt 20 are buried in the case 11, and the upper shaft 21 is projected vertically upward from the upper surface of the case 11. An upper side surface 24 of the head 23 is exposed flush with the upper surface of the case 11.

As shown in FIG. 1, the lower shaft 22 of the bolt 20A buried in the case 11 is projected downward from the case 11. A bolt hole in a bus bar 15 housed in the case 11 is fitted to the shaft 22, which is screwed with a nut 25. Thereby, the bus bar 15 and the bolt 20A are fastened and connected. Similarly, the bolt 20B is fastened with a nut and connected to the bus bar housed in the case.

Figure 3A:
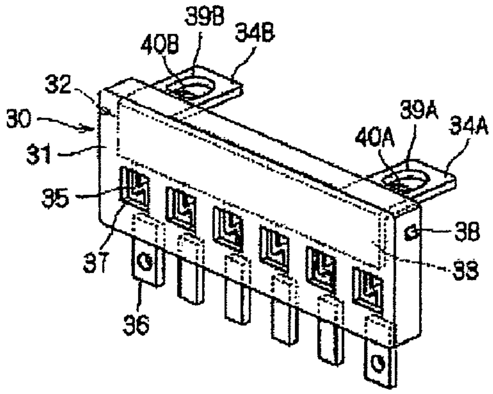
FIG. 3A is a perspective view of the fusible link unit.

The fusible link unit 30 includes a bus bar 32 and a resin exclusive housing 31 housing the bus bar 32, as shown in FIG. 3A. The bus bar 32 is formed by punching out and processing a conductive metal sheet. The bus bar 32 is a bus bar integrally provided with a fusible link, the bus bar being integrally provided with a plurality of fused portions 35 having a narrow S shape.

More specifically, a lateral common circuit 33 is provided in an upper side portion of the bus bar 32; and two power connectors 34A and 34B are perpendicularly bent and horizontally projected from left and right sides of an upper end portion of the common circuit 33. One power connector 34A is a battery side connector, and the other power connector 34B is an alternator side connector. From a lower end portion of the common circuit 33, the plurality of fused portions 35 are projected having an interval in between, such that output terminals 36 are provided at ends of the fused portions 35.

The bus bar 32 is housed in the exclusive housing (i.e., an immediate housing) 31 for a portion from the common circuit 33 to the fused potions 35. The battery side connector 34A, the alternator side connector 34B, and the output terminals 36 are projected from the exclusive housing 31. Further, the exclusive housing 31 is provided with a plurality of window openings 37, so that a fusing condition of the fused portions 35 can be visually checked through the window openings 37.

A pair of locking hooks 38 are provided on side surfaces of the exclusive housing 31. The locking hooks 38 are inserted and engaged to engaging holes 14 engraved on inner walls of the fusible link unit housing recess 12. Thereby, the fusible link unit 30 is locked and fixed to the case 11. Accordingly, the bus bar 32 is also housed within the case 11 as shown in FIG. 4B.

Figure 3B:
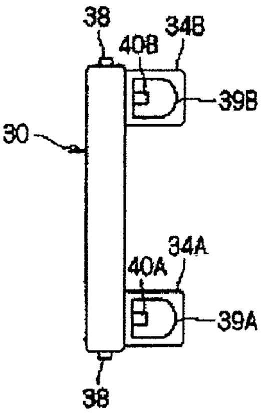
FIG. 3B is a plan view of the fusible link unit.

As shown in FIG. 3B, a bolt hole 39A is provided in the battery side connector 34A, and a bolt hole 39B is provided in the alternator side connector 34B. The bolt holes 39A and 39B have a substantially laterally D-shaped circumference.

From a linear portion of the D shape, spring tabs 40A and 40B, which are obliquely bent downward, are projected inward and bent from a circumference of the bolt holes 39A and 39B, respectively. The spring tabs 40A and 40B have a projection length that ensures an insertion space of a bolt upper shaft 21 of each of the bolts 20 into the bolt holes 39A and 39B, respectively, even when the spring tabs 40A and 40B elastically change from a bent shape to an extended linear shape.

As shown in FIGS. 1 and 2, the fusible link unit 30 is inserted into the fusible link unit housing recess 12 of the case 11. Concurrently, the bolt hole 39A in the battery side connector 34A is fitted to the bolt 20A, and the bolt hole 39B in the alternator side connector 34B is fitted to the bolt 20B.

On a vehicle assembly line, a bolt hole 52 in an LA terminal 51, which is connected to an end portion of a power line 50 connected to a battery, is fitted to the bolt 20A. The LA terminal 51 is placed over the battery side connector 34A of the bus bar 32, and then the nut 26 is screwed from above. Thereby, the battery power line 50 and the bus bar 32 are fastened and connected. Similarly, a bolt hole 57 in an LA terminal 56, which is connected to an end portion of a power line 55 connected to an alternator, is fitted to the bolt 20B. The LA terminal 56 is placed over the alternator side connector 34B of the bus bar 32, and then a nut 27 is screwed from above. Thereby, the alternator power line 55 and the bus bar 32 are fastened and connected.

Figure 4A:
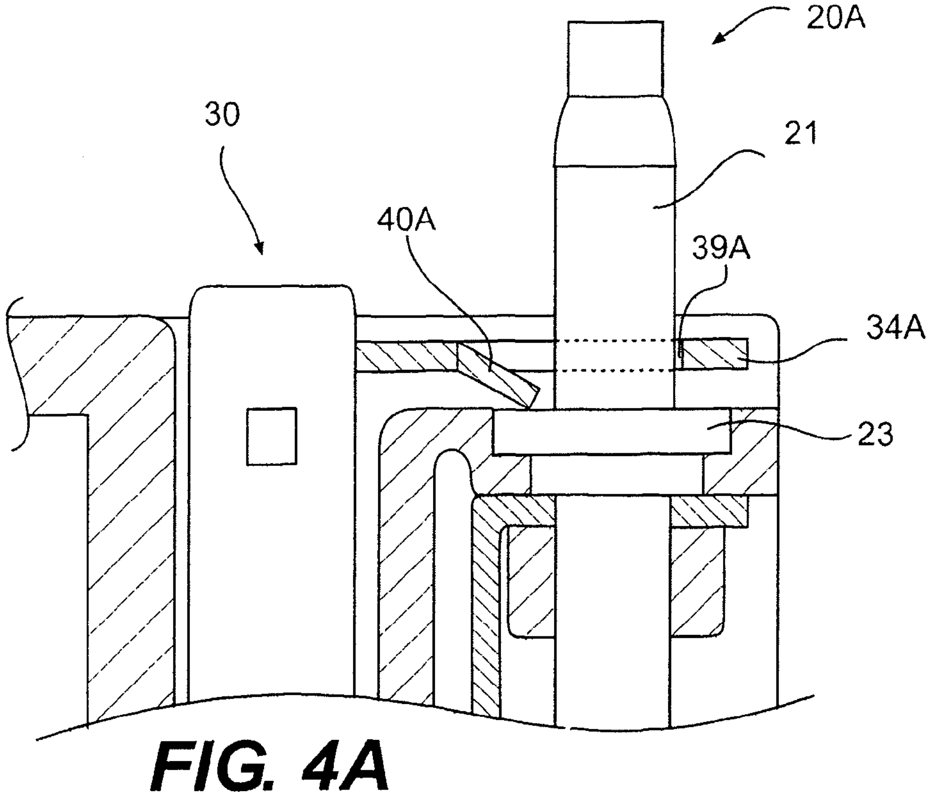
FIG. 4A is a cross-sectional view of a relevant portion illustrating a spring tab of a battery side connector in a process of fitting the fusible link unit to the case, when the fusible link unit is being fitted to the case.
Figure 4B:
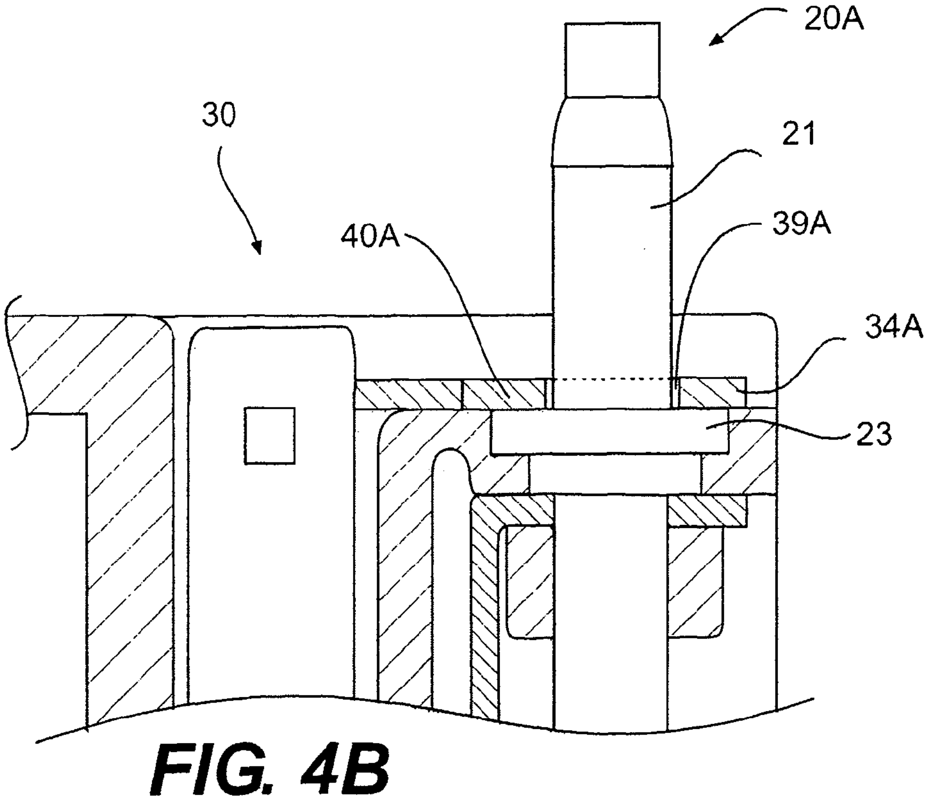
FIG. 4B is a cross-sectional view of a relevant portion illustrating the spring tab of the battery side connector in a process of fitting the fusible link unit to the case, when the fusible link unit has been fitted to the case.
Figure 6A:
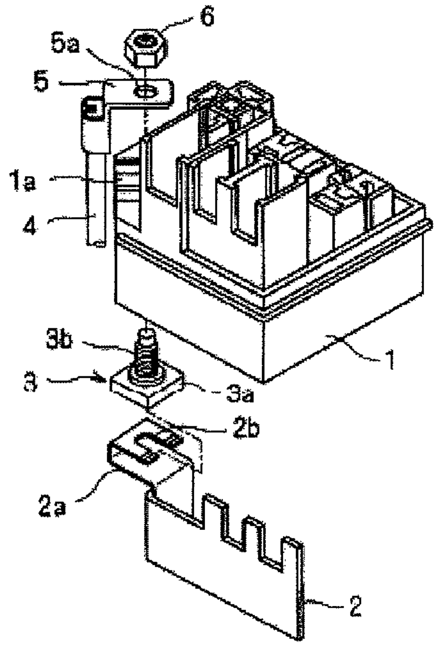
FIGS. 6A and 6B illustrate a conventional example.
Figure 6B:
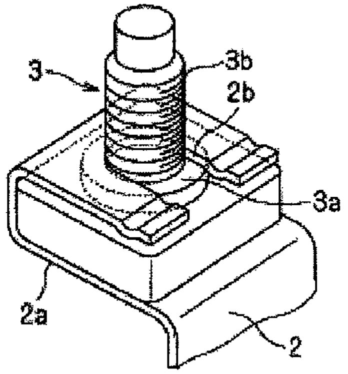
Prior Art Fig. 6B
Figure 7:
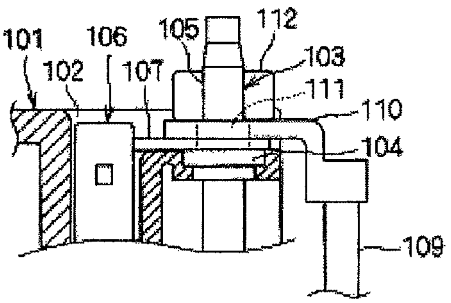
Prior Art Fig. 7
FIG. 7 illustrates an alternative conventional example.
Figure 8:
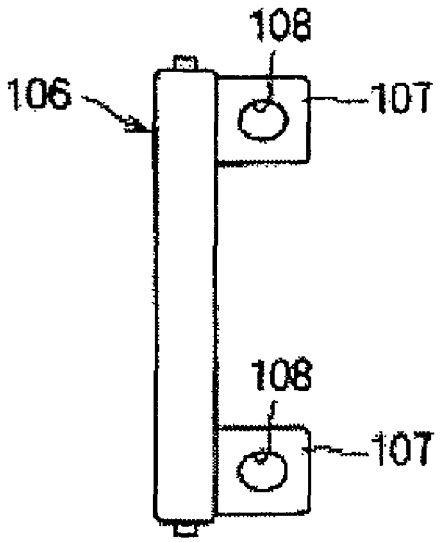
FIG. 8 is a plan view of a fusible link unit shown in FIG. 7.
Figure 9:
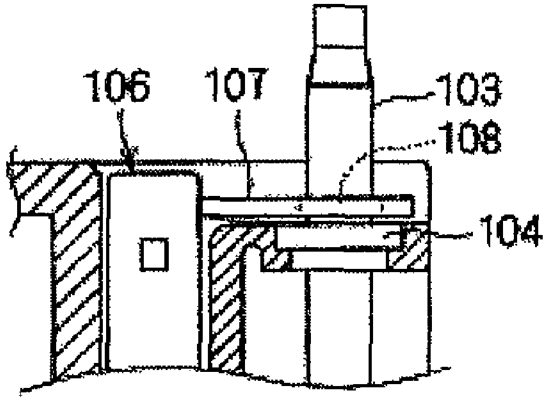
Prior Art Fig. 9
FIG. 9 illustrates a problem with the conventional example.

In the electric junction box 10 having the structure described above, when the fusible link unit 30 is locked and fixed to the fusible link unit housing recess 12 of the case 11, as shown in FIGS. 4A and 4B, the bent spring tab 40A provided on the battery side connector 34A of the bus bar 32 of the fusible link unit 30 comes in surface contact with an upper surface 24 of a head 23 of the bolt 20A with contact pressure. Thereby, even in a process before the LA terminal 51 connected to the battery power line 50 is attached to the bolt 20A and fastened with the nut 26, the battery side connector 34A and the bolt 20A can be contacted stably.

Similarly, the spring tab 34B provided on the alternator side connector 34B of the bus bar 32 of the fusible link unit 30 comes in surface contact with an upper surface 24 of a head 23 of the bolt 20B with contact pressure, even in a process before the LA terminal 56 connected to the alternator power line 55 is attached to the bolt 20B and fastened with the nut 27.

Thereby, even in a state where the LA terminal 51 connected to the power line is not fastened with the nut and fixed to the shaft 21 of the bolt 20A on a vehicle assembly line, a stable conductive circuit can be formed between the bus bar 32 and a conductivity inspection apparatus (not shown in the drawing) via the shafts 21 of the bolts 20A and 20B, when a conductive line terminal connected to the conductivity inspection apparatus is connected to the shafts 21 projected outward from the bolts 20A and 20B. Thus, the conductivity inspection apparatus can accurately perform conductivity inspection of the bus bar 32 and other internal circuits connected to the bus bar 32.

Figure 5A:
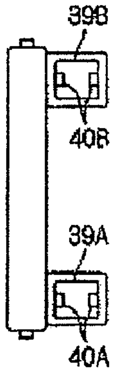
FIGS. 5A and 5B are plan views of a fusible link unit according to modification examples 1 and 2 of the first embodiment.
Figure 5B:
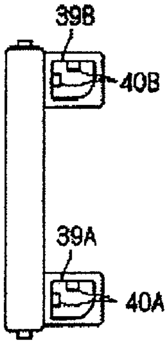

A pair of spring tabs 40A and 40B may be projected, on opposing positions, from the circumference of the bolt holes 39A and 39B, respectively, as shown in FIG. 5A. Alternatively, a pair of spring tabs 40A and 40B may be projected, having a substantially 90 degrees distance in between, from the circumference of the bolt holes 39A and 39B, respectively, as shown in FIG. 5B.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. An electric junction box, comprising:

a case;

a bus bar housed in the case, the bus bar having a power connector, and a bolt hole provided in the power connector; and a bolt connected to the case and inserted through the bolt hole so as to couple the bus bar to the case, wherein a spring tab is projected and bent from a circumference of the bolt hole such that the spring tab comes into surface-to-surface contact with the bolt when the bus bar is housed in the case, and wherein the spring tab extends to a circumference of a shaft of the bolt.

2. The electric junction box according to claim 1, wherein the bus bar being provided integral with a fuse;

the power connector comprising a battery side connector and an alternator side connector;

the bolt hole comprising first and second bolt holes, the first bolt hole being provided within the battery side connector and the second bolt hole being provided within the alternator side connector; and the spring tab comprising first and second spring tabs, the first spring tab projecting from the circumference of the first bolt hole and second spring tab projecting from the circumference of the second bolt hole.

3. The electric junction box according to claim 2, wherein a head of at least one of the first and second bolts is fixed to the case;

at least one of the first and second spring tabs are in surface-to-surface contact with the head of the at least one of the first and second bolts that is fixed to the case; and a power terminal of the electric junction box is fastened to the at least one of the first and second bolts with a nut, and the power terminal configured to be connected to a power line.

4. The electric junction box according to claim 2, wherein a head of each of the first and second bolts is fixed to the case;

the first and second spring tabs are in surface contact with the respective heads of the first and second bolts; and a power terminal of the electric junction box is fastened to at least one of the first and second bolts with a nut, and the power terminal configured to be connected to a power line.

5. The electric junction box according to claim 1, wherein the spring tab comprises a plurality of spring tabs that project from the circumference of the bolt hole.

6. The electric junction box according to claim 1, wherein the spring tab is bent obliquely toward a head of the bolt.

7. The electric junction box according to claim 6, wherein the spring tab is flattened and in surface-to-surface contact with the head of the bolt when the bus bar is fixed to the case.

8. An electric junction box assembly, comprising:

a case;

a bus bar housed in the case, the bus bar having a power connector, and a bolt hole provided in the power connector; and a bolt connected to the case and inserted through the bolt hole so as to couple the bus bar to the case, wherein a spring tab is projected and bent from a circumference of the bolt hole such that the spring tab comes into surface-to-surface contact with and is electrically connected to the bolt when the bus bar is housed in the case and before the power connector is fastened to the bolt with a nut.

9. The electric junction box assembly according to claim 8, wherein the bus bar is provided integral with a fuse;

the power connector comprising a battery side connector and an alternator side connector;

the bolt hole comprising first and second bolt holes, the first bolt hole being provided within the battery side connector and the second bolt hole being provided within the alternator side connector; and the spring tab comprising first and second spring tabs, the first spring tab projecting from the circumference of the first bolt hole and second spring tab projecting from the circumference of the second bolt hole.

10. The electric junction box assembly according to claim 8, wherein a head of at least one of the first and second bolts is fixed to the case;

at least one of the first and second spring tabs are in surface-to-surface contact with the head of the at least one of the first and second bolts that is fixed to the case; and a power terminal of the electric junction box is fastened to the at least one of the first and second bolts with the nut, and the power terminal configured to be connected to a power line.

11. The electric junction box assembly according to claim 8, wherein a head of each of the first and second bolts is fixed to the case;

the first and second spring tabs are in surface contact with the respective heads of the first and second bolts; and a power terminal of the electric junction box is fastened to at least one of the first and second bolts with the nut, and the power terminal configured to be connected to a power line.

12. The electric junction box assembly according to claim 8, wherein the spring tab comprises a plurality of spring tabs that project from the circumference of the bolt hole.

13. The electric junction box assembly according to claim 8, wherein the spring tab is bent obliquely toward a head of the bolt.

14. The electric junction box assembly according to claim 13, wherein the spring tab is flattened and in surface-to-surface contact with the head of the bolt when the bus bar is fixed to the case.

15. The electric junction box assembly according to claim 8, further comprising:

an immediate housing that houses the bus bar;

the case having a fusible link unit housing recess; and locking hooks provided on the immediate housing, wherein inner walls of the fusible link unit housing recess are provided with engaging holes that engage the locking hooks such that the bus bar is also housed in the case and the spring tabs are maintained in the surface-to-surface contact.

* * * * *